United States Patent
Chen et al.

(10) Patent No.: US 10,611,957 B2
(45) Date of Patent: Apr. 7, 2020

(54) QUANTUM DOT LUMINOPHORE

(71) Applicant: TSING YAN TECHNOLOGY CO., LTD., Hsinchu (TW)

(72) Inventors: Ying-Fang Chen, Hsinchu County (TW); Hsueh-Shih Chen, Hsinchu (TW)

(73) Assignee: TSING YAN TECHNOLOGY CO., LTD. (TW)

( * ) Notice: Subject to any disclaimer, the term of this patent is extended or adjusted under 35 U.S.C. 154(b) by 202 days.

(21) Appl. No.: 15/716,658

(22) Filed: Sep. 27, 2017

(65) Prior Publication Data

US 2018/0112129 A1    Apr. 26, 2018

(30) Foreign Application Priority Data

Oct. 21, 2016  (TW) ............... 105133966 A

(51) Int. Cl.
| | |
|---|---|
| C09K 11/70 | (2006.01) |
| H01L 33/50 | (2010.01) |
| H01L 33/06 | (2010.01) |
| H01L 33/08 | (2010.01) |
| H01L 33/56 | (2010.01) |

(52) U.S. Cl.
CPC ............ *C09K 11/70* (2013.01); *H01L 33/06* (2013.01); *H01L 33/08* (2013.01); *H01L 33/502* (2013.01); *H01L 33/56* (2013.01)

(58) Field of Classification Search
CPC ...................................... H01L 33/08
See application file for complete search history.

(56) References Cited

U.S. PATENT DOCUMENTS

| | | | |
|---|---|---|---|
| 2016/0009988 A1* | 1/2016 | Dubrow | C09K 11/025 252/301.6 S |
| 2018/0348577 A1* | 12/2018 | Pousthomis | H01L 33/50 |

OTHER PUBLICATIONS

Liu et al. "Hybrid Gold/Silica/Nanocrystal-Quantum-Dot Superstructures: Synthesis and Analysis of Semiconductor-Metal Interactions" J. Am. Chem. Soc., 2006, 128, 15362-15363. (Year: 2006).*

Chen et al. "Development of Gold Nanoparticle-Enhanced Fluorescent Nanocomposites" Langmuir, 2013, 29, 1584-1591. (Year: 2013).*

* cited by examiner

*Primary Examiner* — Peter F Godenschwager

(57) ABSTRACT

A quantum dot luminophore comprising at least one luminescent core, a spacer layer, an encapsulation layer, and a plurality of quantum dots is disclosed. The luminescent core is designed to emit a red light after being excited by an incident blue light, and the quantum dots are configured to irradiate a green light by the illumination of the blue light and/or the red light. In the present invention, the quantum dots are particularly used to cover or surround the luminescent core for solving the light re-absorption. By such arrangement, even though part of incident blue light (about 10-30%) may be reflected by the luminescent core made of phosphor materials, the reflected blue light still can also be recycled by the quantum dots surrounding the luminescent core, such that the light conversion efficiency and emission intensity of the luminescent core are hence increased because the loss of blue light is decreased.

9 Claims, 11 Drawing Sheets

→ Blue light
⋯⋯> Red light
– – > Green light

QUANTUM DOT LUMINOPHORE

BACKGROUND OF THE INVENTION

1. Field of the Invention

The present invention relates to the technology field of nano-crystalline materials, and more particularly to a quantum dot luminophore.

2. Description of the Prior Art

Light-emitting diode (LED), one kind of lighting element, is widely implemented in various illumination devices used in human life because of its advantages such as small size and long service life.

There are two major types of white LED components. One is mainly constituted by a red LED die, a green LED die and a blue LED die and capable of emitting a white light with high color rendering index (CRI). However, the most important drawback of white LED component of this type is the expensive manufacture cost. White LED component of another one type is called phosphor-converted LED (PC-LED), which commonly comprises a short-wavelength LED die, red phosphor powders and green phosphor powders. It is worth explaining that the short-wavelength LED die can be a blue LED die with wavelength of 450-480 nm or an UV LED die with wavelength of 380-420 nm. During the operation of the PC-LED, the red and green red phosphors are excited by a blue light (or UV light) emitted by the short-wavelength LED die, such that a white light is subsequently produced after the blue light (or UV light) mixes with a red light irradiated from the red phosphor and a blue light emitted by the blue phosphor.

Following Table (1) lists commonly-used red and blue phosphors. From Table (1), it is understood that most of the red and blue phosphors have the important drawback of being difficult to be synthesized. Moreover, the red and blue phosphors able to be easily synthesized still show the drawback of poor thermal stability.

TABLE 1

| Phosphor | Light color | Peak wavelength (nm) | Lumen equivalent (lm/Wopt) | Drawback |
|---|---|---|---|---|
| (Ba, Sr)2SiO4: Eu2+ | G | 525 | 530 | Poor thermal stability |
| Lu3Al5O12: Eu2+ | G | 530 | 465 | With too narrow emission spectrum |
| SrSi2N2O2: Eu2+ | G | 540 | 530 | Hard to be synthesized |
| CaSi5N8: Eu2+ | R | 610 | 270 | Hard to be synthesized |
| Sr2Si5N8: Eu2+ | R | 620 | 240 | Hard to be synthesized |
| CaAlSiN3: Eu2+ | R | 650 | 150 | Hard to be synthesized |
| CaS:Eu2+ | R | 650 | 85 | Poor thermal stability |

Accordingly, U.S. Pat. No. 9,234,129 discloses a surface-modified quantum dot luminophore for replacing the commercial phosphors and use in white LED components. FIG. 1 shows a cross-sectional side view of the surface-modified quantum dot luminophore taught by U.S. Pat. No. 9,234,129. From FIG. 1, it is able to know that the surface-modified quantum dot luminophore 1' comprises a quantum dot (QD) luminophore 11', a moisture barrier layer 13' covering the QD luminophore 11', and a fluorinated coating 15' covering the moisture barrier layer 13', wherein the fluorinated coating 15' is made of fluorine-functionalized organosilane having formula $Si(OR)_3X$. It needs to further explain that R in the formula means light hydrocarbon, and X represents a fluorine-functionalized organic ligand. Compared to the commercial phosphors, this surface-modified QD luminophore 1' exhibits outstanding thermal stability and may have improved stability to air humidity.

Please continuously refer to FIG. 2, which illustrates a cross-sectional side view of an LED component. As FIG. 2 shows, the surface-modified QD luminophores 1' (hereinafter, "QD luminophores") are spread in a colloidal encapsulation 2' of the LED component 10'. It is worth noting that, the colloidal encapsulation 2' is connected to an opening of a housing 4' of the LED component 10', and used for facing an LED die 3' disposed in the internal of the housing 4'. During the operation of the LED component 10', the QD luminophores 1' with relative low positions are firstly excited by a blue light emitted from the LED die 3', and then part of the red light irradiated from the excited QD luminophores 1' would be absorbed by the QD luminophores 1' with relative high positions. As a result, the LED component 10' emits a low-CRI white light due to the poor mixing effect of the blue light and the red light. In addition, owing to the fact that partial (10-30%) of the blue light may be reflected by the QD luminophores 1', the LED component 10' also performs a poor conversion rate.

Thus, in view of the fact that commonly-used phosphors show the drawbacks of poor thermal stability and hard to be synthesized as well as the QD luminophores 1' disclosed by U.S. Pat. No. 9,234,129 still exhibits the most important shortcoming of light re-absorption, the inventors of the present application have made great efforts to make inventive research thereon and eventually provided a quantum dot luminophore.

SUMMARY OF THE INVENTION

In view of the fact that commercial phosphors applied in LED component always show the most important drawback of light re-absorption, primary objective of the present invention is to provide a quantum dot luminophore capable of being implemented in the LED component for replacing the commercial phosphors. The quantum dot luminophore comprises at least one luminescent core, a spacer layer, an encapsulation layer, and a plurality of quantum dots. Particularly, the luminescent core is designed to emit a red light after being excited by an incident blue light, and the quantum dots are configured to irradiate a green light by the illumination of the blue light and/or the red light. In addition, the quantum dots are arranged to cover or surround the luminescent core for solving the light re-absorption. By such arrangement, even though part of incident blue light (10-30%) may be reflected by the luminescent core made of phosphor material, the reflected blue light still can also be recycled by the quantum dots surrounding the luminescent core, such that the light conversion efficiency and emission intensity are hence increased because the loss of blue light is decreased.

In order to achieve the primary objective of the present invention, the inventor of the present invention provides an embodiment for the quantum dot luminophore, comprising:
at least one luminescent core for emitting a first color light after excited by a short-wavelength light;
a spacer layer for covering and enclosing the luminescent core;
an encapsulation layer for covering and enclosing the spacer layer; and
a plurality of quantum dots, being spread in the encapsulation layer for emitting a second color light by the illumination of the short-wavelength light and/or the first color light.

In the embodiment of the quantum dot luminophore, wherein the first color light is red light, and the luminescent core is made by a specific material selected from the group consisting of silicate phosphor, aluminate phosphor, phosphate phosphor, sulfide phosphor, nitride phosphor, nitrogen oxide phosphor, and combination of aforesaid two or more materials.

In the embodiment of the quantum dot luminophore, wherein the first color light is green light, and the luminescent core is made by a specific material selected from the group consisting of silicate phosphor, aluminate phosphor, phosphate phosphor, sulfide phosphor, nitride phosphor, nitrogen oxide phosphor, and combination of aforesaid two or more materials.

In the embodiment of the quantum dot luminophore, wherein the luminescent core has a first refractive index in a range between 1.5 and 2.0 and the quantum dots have a second refractive index in a range from 1.8 to 2.4; moreover, a third refractive index of the spacer layer is in a range between 1.3 and 1.8.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a quantum dot luminophore according to the present invention, embodiments of the present invention will be described in detail with reference to the attached drawings hereinafter.

First Embodiment

Figure 1:
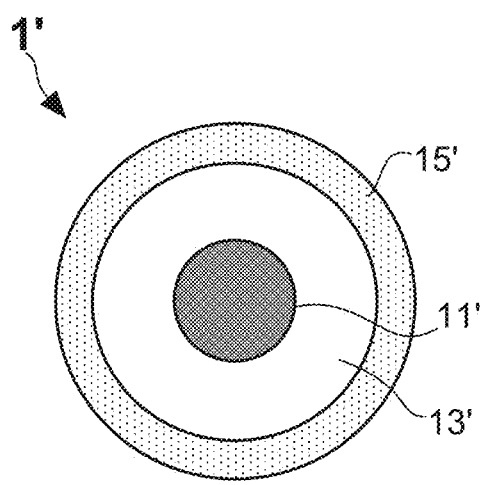
FIG. 1 shows a cross-sectional side view of the surface-modified quantum dot luminophore disclosed by U.S. Pat. No. 9,234,129.
Figure 2:
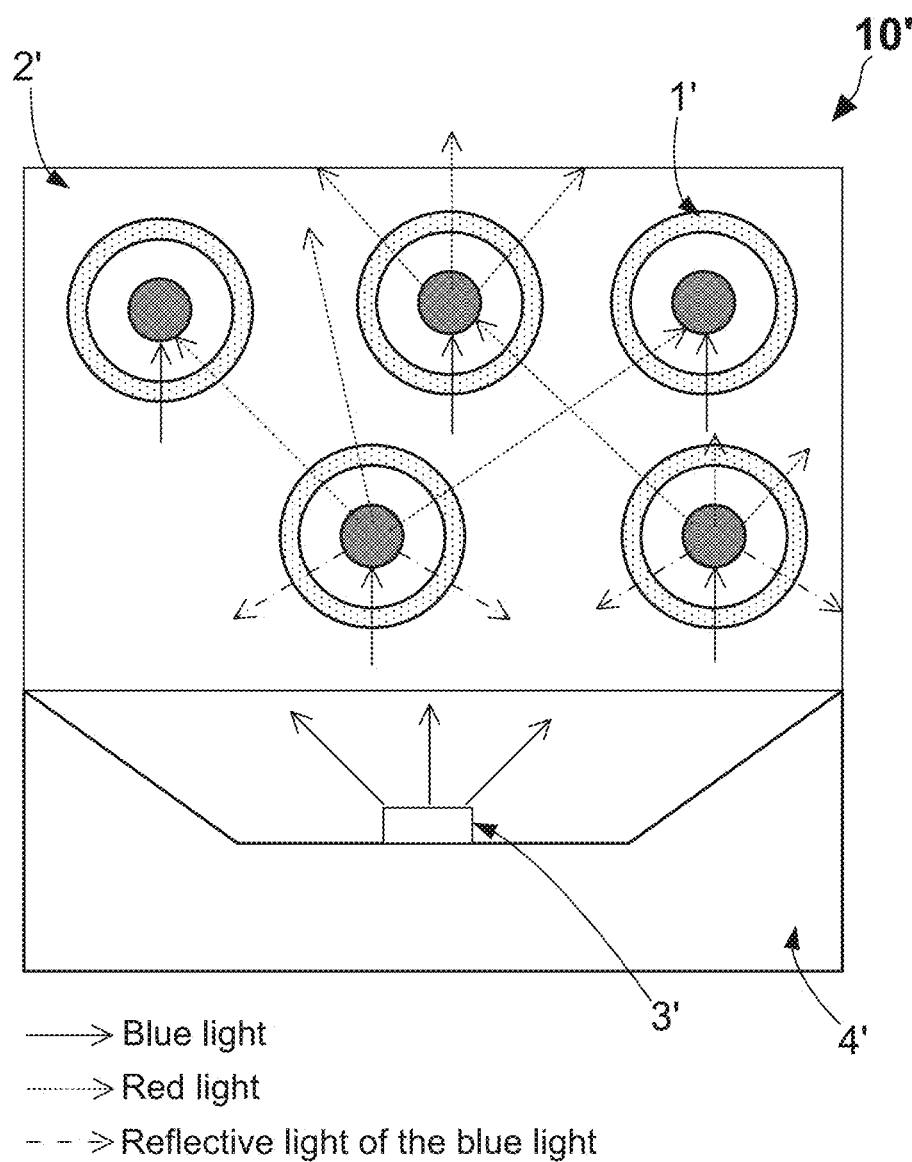
FIG. 2 shows a cross-sectional side view of an LED component.
Figure 3A:
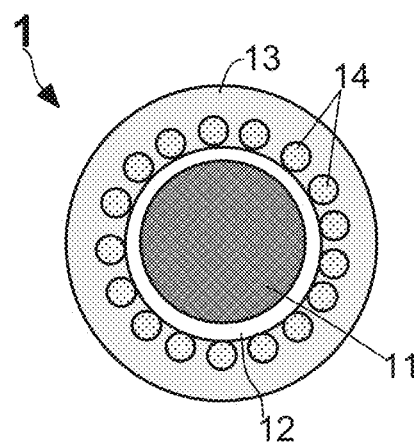
FIG. 3A, FIG. 3B, and FIG. 3C show cross-sectional side diagrams for depicting a first embodiment of a quantum dot luminophore according to the present invention.
Figure 3B:
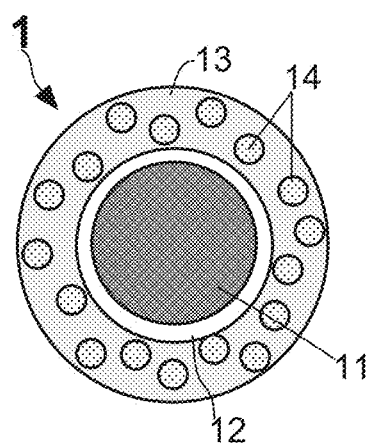
Figure 3C:
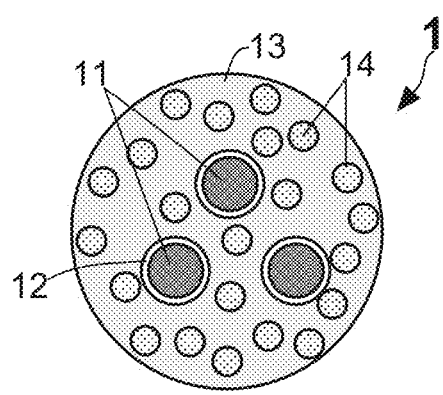
Figure 4A:
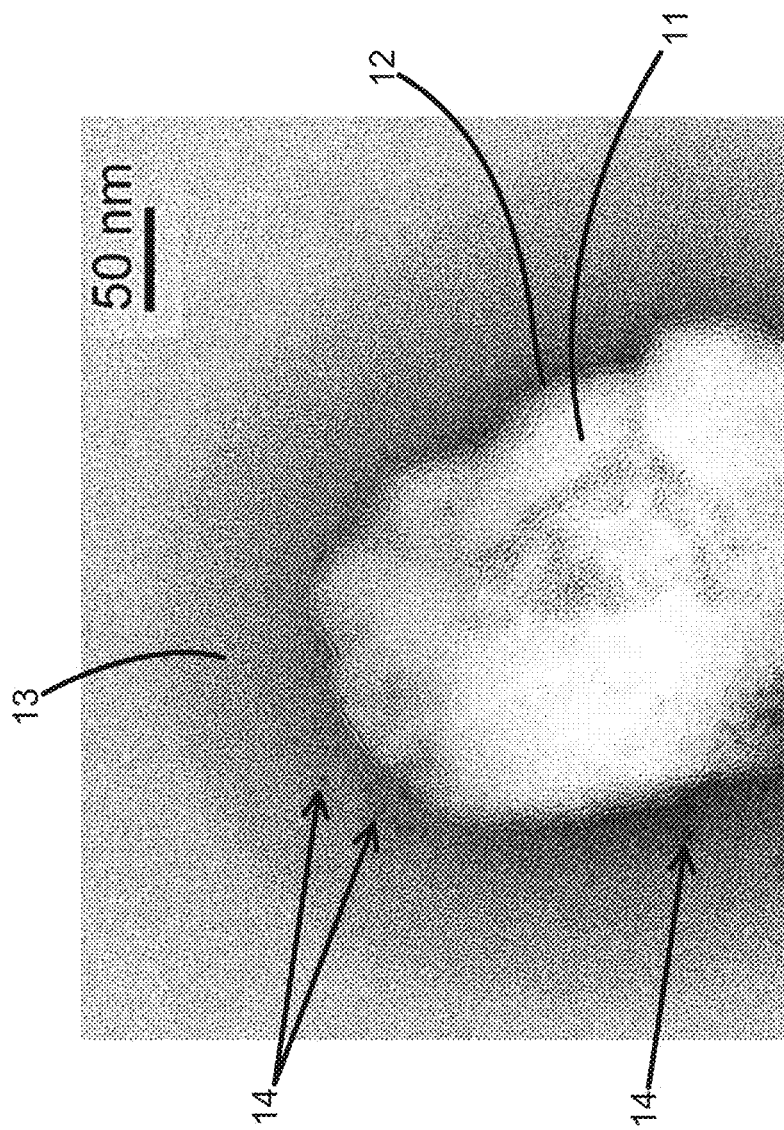
FIG. 4A, FIG. 4B, and FIG. 4C show HRTEM images of the quantum dot luminophore.
Figure 4B:
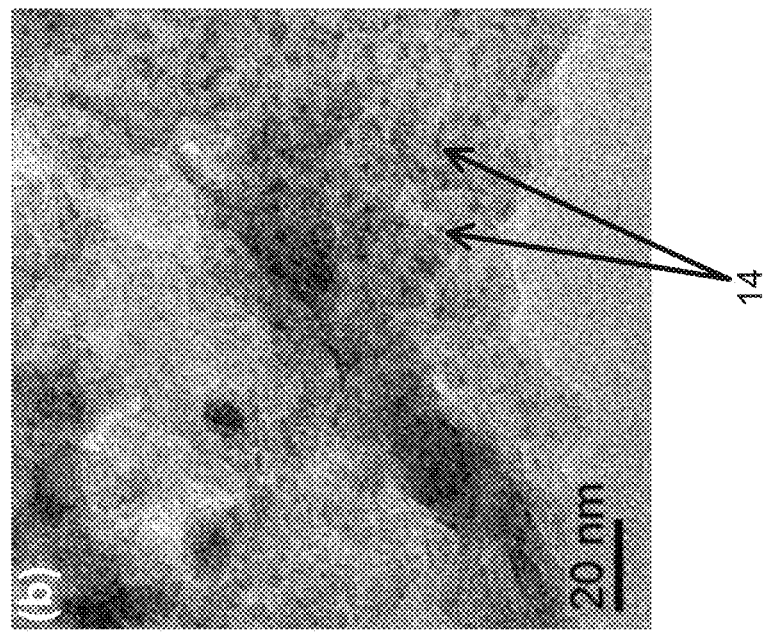
Figure 4B:
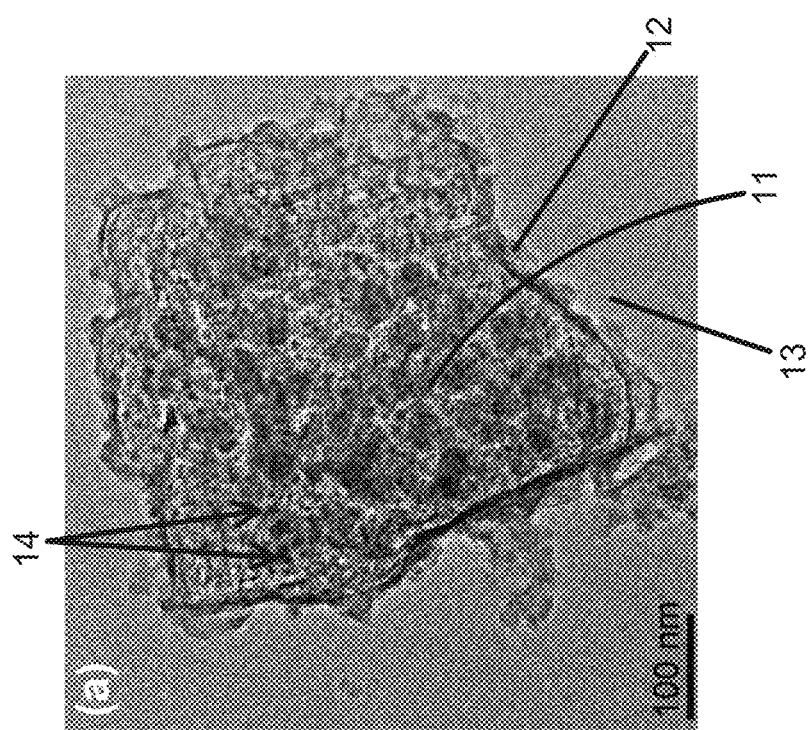
Figure 4C:
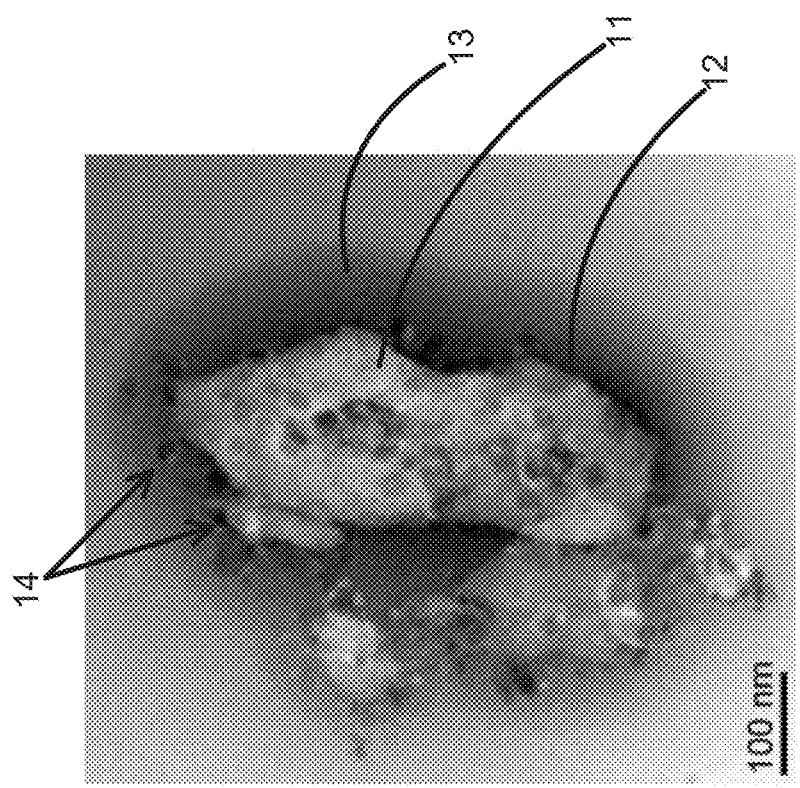

Please refer to FIG. 3A, FIG. 3B, and FIG. 3C, which illustrate cross-sectional side diagrams for depicting a first embodiment of a quantum dot luminophore according to the present invention. Moreover, corresponding HRTEM images of the three quantum dot luminophores in FIG. 3A, FIG. 3B, and FIG. 3C are provided in FIG. 4A, FIG. 4B, and FIG. 4C. In the first embodiment, the quantum dot luminophore 1 comprises at least one luminescent core 11, a spacer layer 12, an encapsulation layer 13, and a plurality of quantum dots 14. According to the particular design of the present invention, the luminescent core 11 is able to emit a first color light after being excited by a short-wavelength light such as blue light, and the quantum dots 14 are configured to irradiate a second color light by the illumination of the short-wavelength light and/or the first color light.

Based on the basic design of the first embodiment, the luminescent core 11 is covered and enclosed by the spacer layer 12, and the encapsulation layer 13 further covers and encloses the spacer layer 12. Moreover, the quantum dots 14 are spread in the encapsulation layer 13 and locate between the encapsulation layer 13 and the spacer layer 12. For instance, FIG. 3A and FIG. 4A indicate that the quantum dots 14 are regularly provided on the outer surface of the spacer layer 12 and enclosed by the encapsulation layer 13. Moreover, from FIG. 3B and FIG. 4B, it is understood that the quantum dots 14 are also be irregularly doped in the encapsulation layer 13. On the other hand, FIG. 3C and FIG. 4C indicate that the quantum dot luminophore 1 comprises several luminescent cores 11, and the quantum dots 14 are irregularly spread in the encapsulation layer 13.

Figure 5:
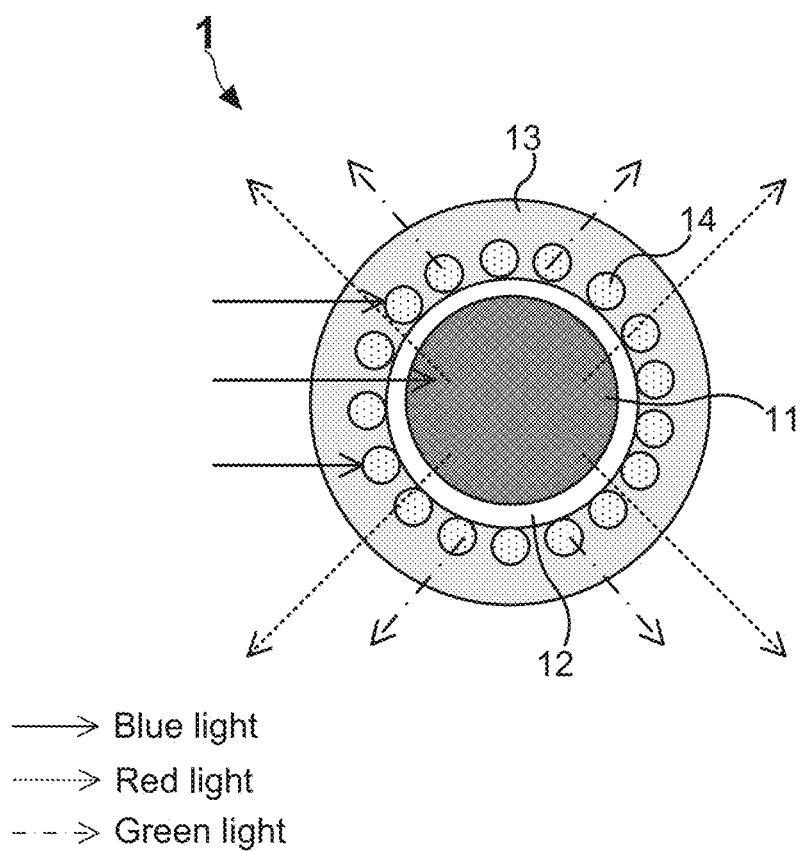
FIG. 5 shows a cross-sectional side view of the quantum dot luminophore.

Referring to FIG. 3A, FIG. 3B, and FIG. 3C again, and please simultaneously refer to FIG. 5, where a cross-sectional side diagram of the quantum dot luminophore is shown. The primary technology feature of the present invention is to use a short-wavelength light such as blue light to illuminate the quantum dot luminophore 1, so as to make the quantum dot luminophore 1 simultaneously emit a red light and a green light after being excited by the short-wavelength light. It is worth explaining that, the red light is irradiated from the luminescent core 11, and the green light is converted from the blue light or the red light by the quantum dots 14. Moreover, the luminescent core 11 is made of a fluorescent particle, and exemplary materials of the fluorescent particle are listed in following Table (2).

TABLE 2

| Types of fluorescent particle | Corresponding exemplary material |
| --- | --- |
| Aluminate phosphor | Eu doped Y—Al—O multi-composition phosphor |
| Silicate phosphor | $Ca_3Si_2O_7:Eu^{2+}$ |
| Phosphate phosphor | $KSr_{1-x}PO_4:Tb_x$ |
|  | $K_2SiF_6:Mn^{4+}$ (KSF) |
| Sulfide phosphor | ZnS:X |
|  | X = Au, Ag, Cu, Mn, Cd |
| Nitride phosphor | β-SiAlON:$Eu^{2+}$ |
| Other-type phosphor | $SrGa_2S_4:Eu^{2+}$ (SGS) |

It needs to emphasize that, the luminescent core 11 is only limited to emit the red light after being excited by the short-wavelength light. Therefore, the luminescent core 11 is not limited to be made of fluorescent particle (phosphor). The luminescent core 11 can also be made of a quantum dot with particle size greater than 5 nm, and exemplary materials of the quantum dot are listed in following Table (3).

TABLE 3

| Types of quantum dot (QD) | Corresponding exemplary material |
|---|---|
| Group II-VI compounds | CdSe or CdS |
| Group III-V compounds | (Al, In, Ga)P, (Al, In, Ga)As, or (Al, In. Ga)N |
| Group III-V compounds having core-shell structure | CdSe/ZnS core-shell QD |
| Group III-V compounds having core-shell structure | InP/ZnS core-shell QD |
| Group II-VI compounds having non-spherical alloy structure | ZnCdSeS |

It must particularly emphasize that, the materials listed in the Table (2) and Table (3) are not used for approaching a limitation in use of the manufacturing materials of the luminescent core 11. On the other hand, the quantum dots 14 surrounding the luminescent core 11 are configured to emit green light by the illumination of the red light or the short-wavelength light, and that means the size of the quantum dots 14 must be in a range between 2 nm and 10 nm. Moreover, and exemplary manufacturing materials for the quantum dot 14 are listed in above Table (3). In addition, exemplary materials for making the spacer layer 12 are listed in following Table (4).

TABLE 4

| Material types | Corresponding exemplary material(s) |
|---|---|
| Oxide | $SiO_2$ |
| Metal oxide | $Al_2O_3$, $SiTiO_{4-x}$ |
| Organic monomer | tetraethyl orthosilicate, isobornyl acrylate, lauryl acrylate, isodecyl acrylate, caprolactone acrylate, isooctyl acrylate, cyclic trimethylolpropane formal acrylate, phenoxy benzyl acrylate, trimethyl cyclohexyl acrylate, benzyl acrylate, phenol (EO) acrylate, phenol (EO)2 acrylate, phenol (EO)4 acrylate, tetrahydrofurfuryl acrylate, nonyl phenol(EO)8 acrylate, nonyl phenol (PO)2 acrylate, ethoxyethoxy ethyl acrylate, isodecyl methacrylate, phenoxy methacrylate, stearyl methacrylate, methoxy PEG500, methacrylate, methoxy PEG600, methoxy PEG350, N,N-diethyl acrylamide, acryloyl morpholine, 1,9-nonanediol dimethacrylate, 2-hydroxy 3-phenoxy propyl acrylate, glycerol dimethacrylate, dicyclopentenyl oxyethyl methacrylate, lauryl methacrylate, |
| organic oligomer | hydrophobic aliphatic urethane acrylate, aliphatic silicone, acrylate oligomer, siliconized urethane acrylate oligomer, pentaerythritol triacrylate, aliphatic multifunctional acrylate, silicone acrylate, bisphenol A epoxy diacrylate, alkoxylated nonylphenol acrylate, |

TABLE 4-continued

| Material types | Corresponding exemplary material(s) |
|---|---|
| | aromatic polyether based urethane, triacrylate oligomer, aliphatic urethane acrylate, polyester acrylate, polybutadiene, ethylene glycol dimetharylate, siloxane. |
| Polymer | silicone polymer |

Figure 6:
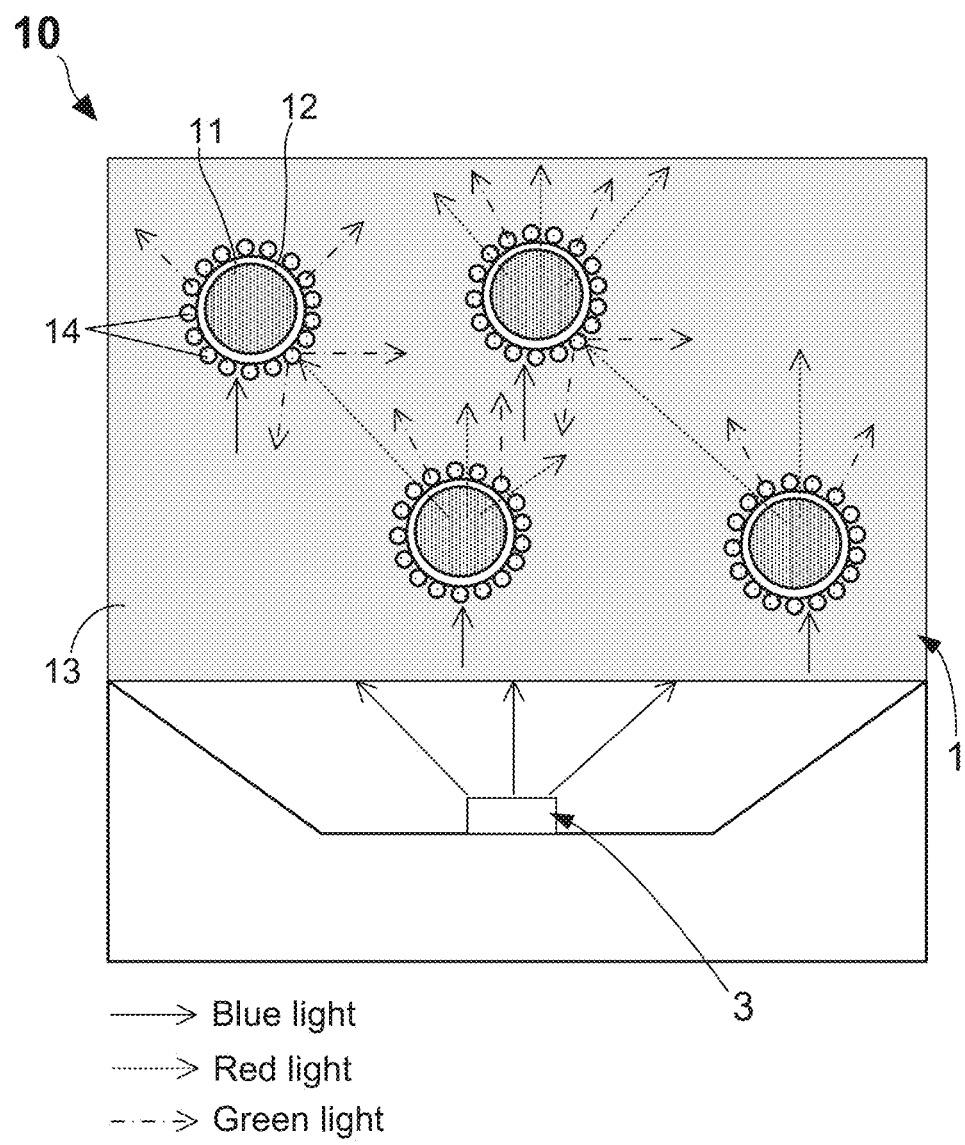
FIG. 6 shows a cross-sectional side view of an LED component having the quantum dot luminophores.

FIG. 6 shows a cross-sectional side view of an LED component having the quantum dot luminophores. As FIG. 6 shows, the encapsulation layer 13 are directly used as a colloidal encapsulation of the LED component 10; moreover, as FIG. 3C and FIG. 6 show, the quantum dot luminophores 1 comprises luminescent cores 11, spacer layer 12, and quantum dots 14 are spread in the colloidal encapsulation (i.e., the encapsulation layer 13). The manufacturing material of the encapsulation layer 13 can be silicon gel, poly(methyl methacrylate) (PMMA), polycarbonate (PC), poly(vinyl chloride) (PVC), polystyrene (PS), polyethylene terephthalate (PET), epoxy, metal oxide, or combination of aforesaid two or more materials.

From FIG. 6, it is understood that, during the operation of the LED component 10, the quantum dot luminophores 1 with relative low positions are excited by a blue light emitted from the LED die 3, such that the quantum dot luminophores 1 would subsequently irradiate a red light and a green light. In the meantime, even though part of the red light and the green light may be directed to the quantum dot luminophores 1 with relative high positions, the red light and green light would just excite the quantum dots 14 surrounding the luminescent cores 11, but fail to be re-absorbed by the luminescent cores 11.

The second technology feature of the present invention is to particular design the refractive index of the luminescent cores 11, the spacer layer 12, the quantum dots 14, and the encapsulation layer 13. Related refractive index values are integrated in following Table (5).

TABLE 5

| Layer | RI value |
|---|---|
| luminescent core 11 | 1.5-2.0 |
| spacer layer 12 | 1.3-1.8 |
| quantum dots 14 | 1.8-2.4 |
| encapsulation layer 13 | radially outward varies from 1.8 to 1.3 |

Figure 7:
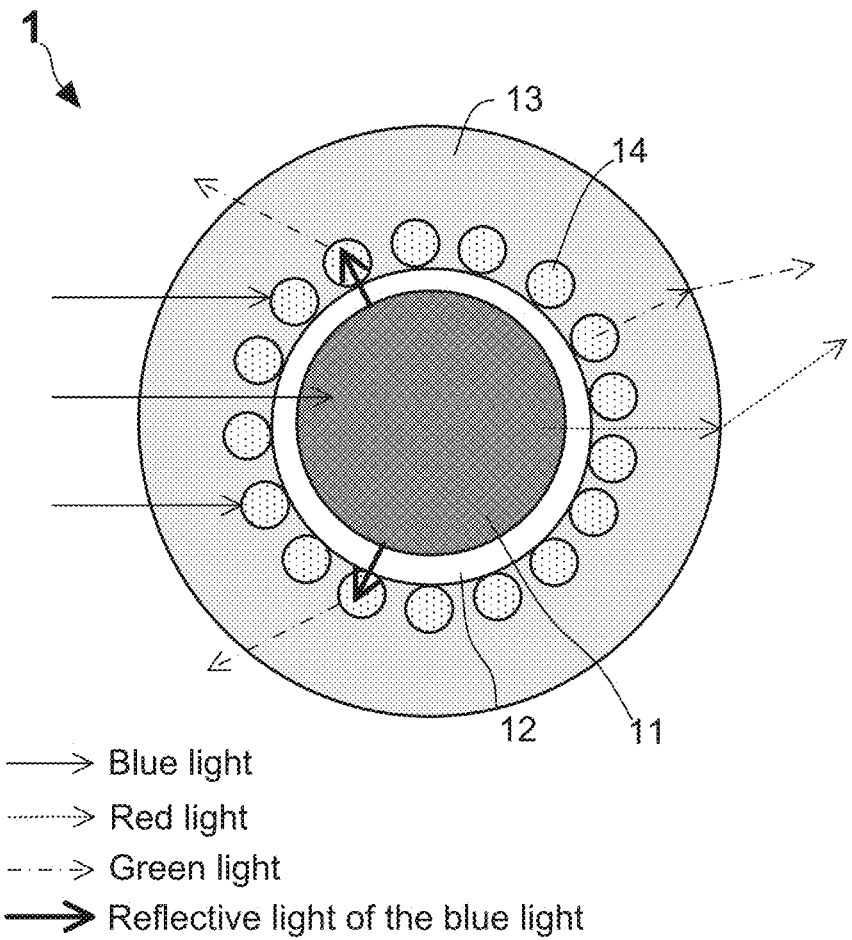
FIG. 7 shows a cross-sectional side view of the quantum dot luminophore.

FIG. 7 shows a cross-sectional side view of the quantum dot luminophore. From FIG. 7, it is understood that the red light emitted by the luminescent core 11 and the green light emitted by the quantum dots 14 can be easily directed to the air because the aforesaid second technology is applied to the quantum dot luminophore 1. It is worth noting that, even though part of incident blue light (cal. 10-30%) are reflected by the luminescent cores 11 made of fluorescent materials, the reflected blue light can be recycled by the quantum dots 14 surrounding the luminescent core 11, such that the conversion efficiency and emission intensity of the luminescent cores 11 are hence increased because the loss of blue light is decreased. Moreover, the intensity of the green light emitted by the quantum dots 14 is also elevated.

Figure 8:
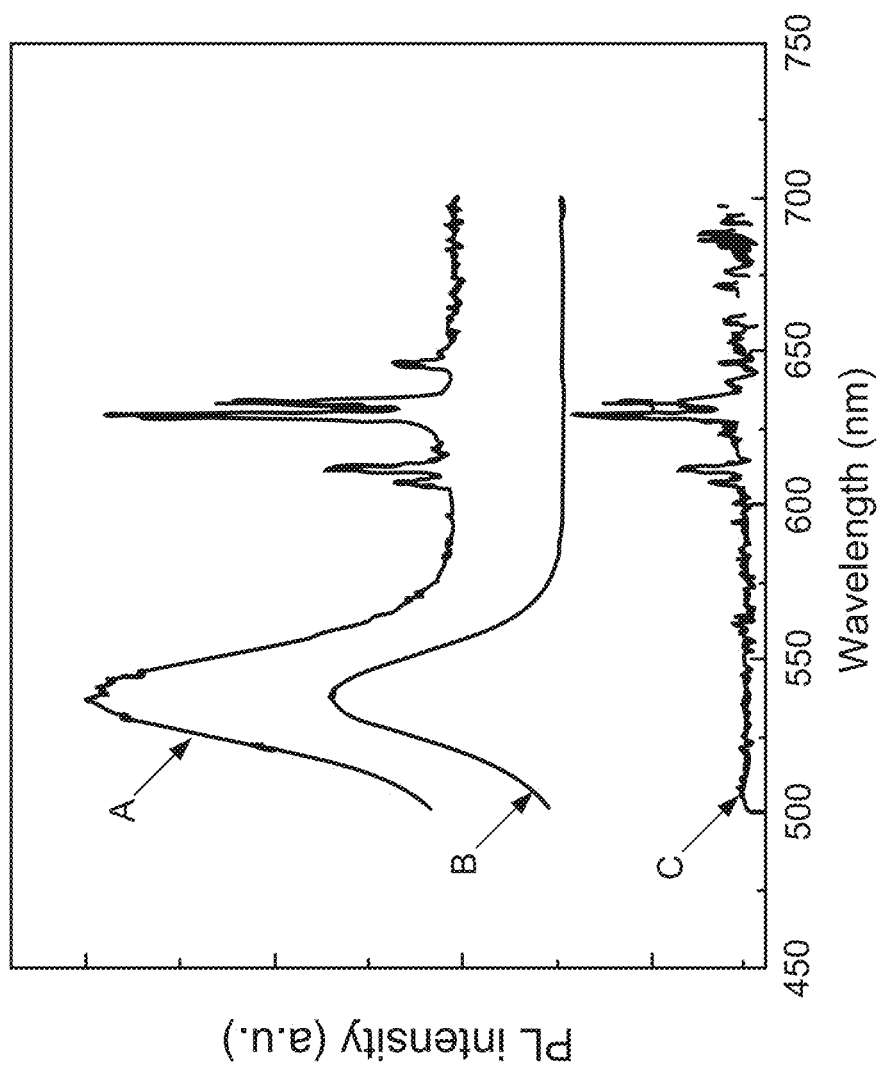
FIG. 8 shows photoluminescence spectra.

Please continuously refer to photoluminescence spectra provided in to FIG. 8, wherein basic information of curves A, B and C are integrated in following Table (6).

TABLE 6

| Curve | Information |
|-------|-------------|
| A | Photoluminescence spectrum measured by using a blue light to illuminate the quantum dot luminophore 1 of the present invention. |
| B | Photoluminescence spectrum measured by using a blue light to illuminate a conventional quantum dot luminophore comprising a plurality of quantum dots and an encapsulation layer made of silicon gel. |
| C | Photoluminescence spectrum measured by using a blue light to illuminate a red phosphor. |

From FIG. 8, it is found that the photoluminescence spectrum of the quantum dot luminophore 1 provided by the present invention comprises red light spectrum and green light spectrum, but the photoluminescence spectrum of the red phosphor does just comprise red light spectrum. It is worth noting that, because the photoluminescence spectrum of the conventional quantum dot luminophore only comprises green spectrum, it is able to know that the particle size of the quantum dots in the conventional quantum dot luminophore is around 2.3-2.8 nm. Moreover, from FIG. 8, it can further find that the PL intensity of the quantum dot luminophore 1 provided by the present invention is higher than the conventional quantum dot luminophore's and the red phosphor's.

Therefore, through above descriptions, the first embodiment of the quantum dot luminophore proposed by the present invention have been introduced completely and clearly; in summary, the present invention includes the advantages of:

(1) In view of the fact that commercial phosphors applied in LED component always show the most important drawback of light re-absorption, the present invention provides a quantum dot luminophore 1 capable of being implemented in the LED component for replacing the commercial phosphors. The quantum dot luminophore 1 comprises at least one luminescent core 11, a spacer layer 12, an encapsulation layer 13, and a plurality of quantum dots 14. Particularly, the luminescent core 11 is designed to emit a red light after being excited by an incident blue light, and the quantum dots 14 are configured to irradiate a green light by the illumination of the blue light and/or the red light. In addition, the quantum dots 14 are arranged to cover or surround the luminescent core 11 for solving the light re-absorption. By such arrangement, even though part of incident blue light (cal. 10-30%) are reflected by the luminescent core 11 made of phosphor, the reflected blue light can be recycled by the quantum dots 14 surrounding the luminescent core 11, such that the light conversion efficiency and emission intensity of the luminescent core 11 are hence increased because the loss of blue light is decreased.

Second Embodiment

Figure 9C:
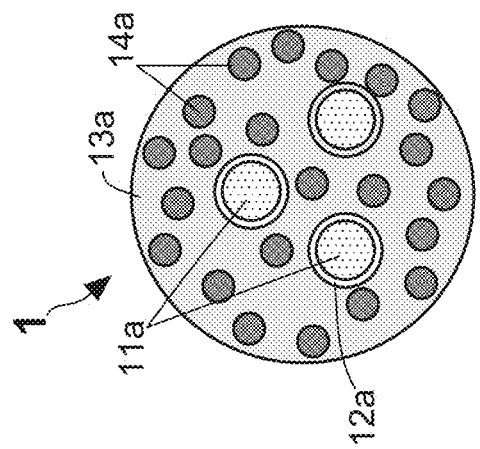
FIG. 9A, FIG. 9B, and FIG. 9C show cross-sectional side diagrams for depicting a second embodiment of the quantum dot luminophore.
Figure 9B:
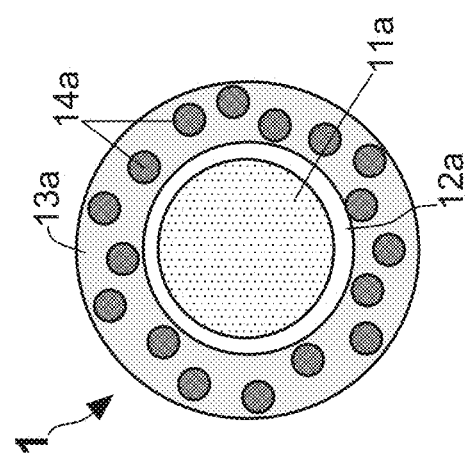
Figure 9A:
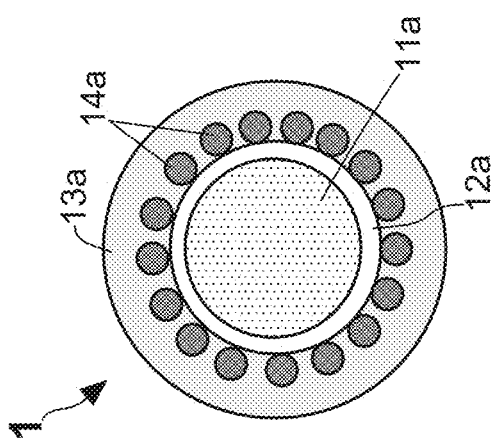

Please refer to FIG. 9A, FIG. 9B, and FIG. 9C, which illustrate cross-sectional side diagrams for depicting a second embodiment of the quantum dot luminophore of the present invention. In the second embodiment, the quantum dot luminophore 1 comprises at least one luminescent core 11a, a spacer layer 12a, an encapsulation layer 13a, and a plurality of quantum dots 14a, wherein the luminescent core 11a is covered and enclosed by the spacer layer 12a, and the encapsulation layer 13a further covers and encloses the spacer layer 12a. Moreover, the quantum dots 14a are spread in the encapsulation layer 13 and locate between the encapsulation layer 13 and the spacer layer 12. For instance, FIG. 9A indicates that the quantum dots 14a are regularly provided on the outer surface of the spacer layer 12a and enclosed by the encapsulation layer 13a. Moreover, from FIG. 9B, it is understood that the quantum dots 14a are also be irregularly doped in the encapsulation layer 13. On the other hand, FIG. 9C indicates that the quantum dot luminophore 1 comprises several luminescent cores 11a, and the quantum dots 14a are irregularly spread in the encapsulation layer 13a.

Differing from above-mentioned first embodiment, the luminescent core 11a of the second embodiment is configured to emit a green light after being excited by a short-wavelength light such as blue light. Moreover, the quantum dots 14a are particularly designed to irradiate a red light by the illumination of the blue light or the green light. Based on above basic designing principles, it is understood that the luminescent core 11a must be a phosphorescent particle. Moreover, exemplary materials of the phosphorescent particle are listed in following Table (6).

TABLE 6

| Types of phosphorescent particle | Corresponding exemplary material |
|----------------------------------|----------------------------------|
| Aluminate phosphor | Tb doped Y—Al—O multi-composition phosphor, Ce and Tb co-doped Y—Al—O multi-composition phosphor |
| Silicate phosphor | $Ba_9Sc_2(SiO_4)_6:Eu^{2+}$ |
| Phosphate phosphor | $KSr_{1-x}PO_4:Tb_x$ |
| | $K_2SiF_6:Mn^{4+}$ (KSF) |
| Sulfide phosphor | ZnS:X |
| | X = Au, Ag, Cu, Mn, Cd |
| Nitride phosphor | $\beta$-SiAlON:$Eu^{2+}$ |
| Other-type phosphor | $SrGa_2S_4:Eu^{2+}$ (SGS) |

It must particularly emphasize that, the materials listed in the Table (6) are not used for approaching a limitation in use of the manufacturing materials of the luminescent core 11a. On the other hand, the quantum dots 14a surrounding the luminescent core 11a are configured to emit red light by the illumination of the short-wavelength light or the green light, and that means the size of the quantum dots 14a must be greater than 5 nm. Moreover, and exemplary manufacturing materials for the quantum dot 14a are listed in above Table (3). On the other hand, the spacer layer 12a used for covering the luminescent core 11a can be made of oxide, metal oxide, organic monomer, organic oligomers, polymer, or combination of aforesaid two or more materials, wherein the exemplary manufacturing materials for the spacer layer 12a are listed in above Table (4). In addition, what is the same as the above-mentioned first embodiment is that, the encapsulation layer 13a in the second embodiment can also be directly used as a colloidal encapsulation of an LED component. The manufacturing material of the encapsulation layer 13a can be silicon gel, poly(methyl methacrylate) (PMMA), polycarbonate (PC), poly(vinyl chloride) (PVC), polystyrene (PS), polyethylene terephthalate (PET), epoxy, and combination of aforesaid two or more materials.

The above description is made on embodiments of the present invention. However, the embodiments are not intended to limit scope of the present invention, and all equivalent implementations or alterations within the spirit of the present invention still fall within the scope of the present invention.

What is claimed is:

1. A quantum dot luminophore, comprising:
at least one luminescent core for emitting a first color light after excited by a light that is selected from the group consisting of blue light and ultraviolet (UV) light;
a spacer layer for covering and enclosing the luminescent core;
an encapsulation layer for covering and enclosing the spacer layer; and
a plurality of quantum dots, being spread in the encapsulation layer for emitting a second color light by the illumination of the light and/or the first color light;
wherein the luminescent core has a first refractive index in a range between 1.5 and 2.0, the quantum dots having a second refractive index in a range from 1.8 to 2.4, and the spacer layer having a third refractive index that is in a range between 1.3 and 1.8.

2. The quantum dot luminophore of claim 1, wherein the spacer layer is made by a specific material selected from the group consisting of oxide, metal oxide, organic monomer, organic oligomers, polymer, and combination of aforesaid two or more materials.

3. The quantum dot luminophore of claim 1, wherein the encapsulation layer is made by a specific material selected from the group consisting of silicon gel, poly(methyl methacrylate) (PMMA), polycarbonate (PC), poly(vinyl chloride) (PVC), polystyrene (PS), polyethylene terephthalate (PET), epoxy, metal oxide, and combination of aforesaid two or more materials.

4. The quantum dot luminophore of claim 1, wherein the first color light is red light, and the luminescent core is made by a specific material selected from the group consisting of silicate phosphor, aluminate phosphor, phosphate phosphor, sulfide phosphor, nitride phosphor, nitrogen oxide phosphor, and combination of aforesaid two or more materials.

5. The quantum dot luminophore of claim 1, wherein the first color light is red light, and the luminescent core is made by a specific material selected from the group consisting of Group II-VI compound, Group III-V compound, Group III-V compound having core-shell structure, Group III-V compound having core-shell structure, Group II-VI compound having non-spherical alloy structure, and combination of aforesaid two or more materials.

6. The quantum dot luminophore of claim 1, wherein the first color light is green light, and the luminescent core is made by a specific material selected from the group consisting of silicate phosphor, aluminate phosphor, phosphate phosphor, sulfide phosphor, nitride phosphor, nitrogen oxide phosphor, and combination of aforesaid two or more materials.

7. The quantum dot luminophore of claim 1, wherein the second color light is green light, and the luminescent core is made by a specific material selected from the group consisting of Group II-VI compound, Group III-V compound, Group III-V compound having core-shell structure, Group III-V compound having core-shell structure, Group II-VI compound having non-spherical alloy structure, and combination of aforesaid two or more materials.

8. The quantum dot luminophore of claim 1, wherein the second color light is red light, and the luminescent core is made by a specific material selected from the group consisting of Group II-VI compound, Group III-V compound, Group III-V compound having core-shell structure, Group III-V compound having core-shell structure, Group II-VI compound having non-spherical alloy structure, and combination of aforesaid two or more materials.

9. The quantum dot luminophore of claim 1, wherein the encapsulation layer has a gradient refractive index, and the gradient refractive index radially outward varies from 1.8 to 1.3.

* * * * *